United States Patent
Curtin et al.

(10) Patent No.: US 8,511,022 B2
(45) Date of Patent: Aug. 20, 2013

(54) ACCESS FLOOR PANEL HAVING INTERMINGLED DIRECTIONAL AND NON-DIRECTIONAL AIR PASSAGEWAYS

(75) Inventors: Daniel J. Curtin, Alexandria, VA (US); William W. Reynolds, Pasadena, MD (US); Daniel B. Kennedy, Lovettsville, VA (US)

(73) Assignee: Tate Access Floors Leasing, Inc., Wilmington, DE (US)

( * ) Notice: Subject to any disclaimer, the term of this patent is extended or adjusted under 35 U.S.C. 154(b) by 0 days.

(21) Appl. No.: 13/355,066

(22) Filed: Jan. 20, 2012

(65) Prior Publication Data

US 2013/0186026 A1     Jul. 25, 2013

(51) Int. Cl.
E04B 1/70          (2006.01)

(52) U.S. Cl.
USPC ............................................. 52/302.1

(58) Field of Classification Search
USPC ......... 52/19, 20, 177, 220.1, 220.7; 454/184, 454/187
See application file for complete search history.

(56) References Cited

U.S. PATENT DOCUMENTS

| | | | | |
|---|---|---|---|---|
| 3,303,771 | A | * | 2/1967 | Nesher et al. ............... 454/187 |
| 4,729,292 | A | * | 3/1988 | Marton ....................... 454/284 |
| 4,745,715 | A | * | 5/1988 | Hardwicke et al. ......... 52/126.6 |
| 4,825,603 | A | * | 5/1989 | Hardwicke et al. ......... 52/126.6 |
| 4,877,522 | A | * | 10/1989 | Toei et al. .................. 210/198.2 |
| 4,991,496 | A | * | 2/1991 | Kuno et al. ................. 454/300 |
| 5,192,348 | A | | 3/1993 | Ludwig |
| 5,402,617 | A | * | 4/1995 | Daw et al. .................... 52/630 |
| 5,876,281 | A | * | 3/1999 | Hirasawa et al. ............ 454/305 |
| 6,019,677 | A | | 2/2000 | Demster |
| 6,099,406 | A | | 8/2000 | Demster |
| 6,256,952 | B1 | * | 7/2001 | Fahy et al. ................... 52/263 |
| 7,232,369 | B2 | * | 6/2007 | Karidis et al. ............... 454/274 |
| D567,398 | S | * | 4/2008 | Meyer ........................ D25/156 |
| 7,907,402 | B2 | | 3/2011 | Caveney |
| 2007/0173189 | A1 | | 7/2007 | Lewis |
| 2011/0122570 | A1 | | 5/2011 | Beck et al. |
| 2012/0060429 | A1 | | 3/2012 | Reynolds et al. |
| 2012/0156981 | A1 | * | 6/2012 | Curtin et al. ................. 454/184 |
| 2012/0164929 | A1 | * | 6/2012 | Meyer ......................... 454/184 |

FOREIGN PATENT DOCUMENTS

| | | |
|---|---|---|
| DE | 20 2009 007257 U1 | 11/2009 |
| GB | 2 480 470 A | 11/2011 |
| JP | A-2011-179712 | 9/2011 |

OTHER PUBLICATIONS

Tate, "PERF 1000 Air Flow Panel-24," Tate Access Floors, Inc., 2008, Jessup, MD, United States of America.
U.S. Appl. No. 12/878,657, filed Sep. 9, 2010.
Sep. 12, 2012 International Search Report issued in PCT/US2012/033221.
Sep. 12, 2012 Written Opinion issued in PCT/US2012/033221.

* cited by examiner

*Primary Examiner* — Joshua J Michener
*Assistant Examiner* — Keith Minter
(74) *Attorney, Agent, or Firm* — Oliff & Berridge, PLC (57) ABSTRACT

An access floor panel is disclosed that has a top plate with a plurality of non-directional air passageways intermingled with a plurality of directional air passageways. The directional air passageways are configured to direct airflow through them at an angle to the upper surface of the top plate of other than 90°. The directional air passageways include an opening in the top plate and a tab adjacent to each opening that is at an angle with respect to top surface of the top plate of other than 90°. Due to the intermingling of the non-directional air passageways and the directional air passageways, the composite air flow direction through the non-directional air passageways and the directional air passageways is at an angle with the top plate of other than 90°.

20 Claims, 8 Drawing Sheets

ACCESS FLOOR PANEL HAVING INTERMINGLED DIRECTIONAL AND NON-DIRECTIONAL AIR PASSAGEWAYS

BACKGROUND

1. Field of the Invention

This invention relates to access floor panels. In particular, this invention relates to access floor panels having spaced openings or passageways for air to pass through the panels.

2. Background of the Invention

A typical data center includes multiple IT racks. Those racks, and the associated peripheral equipment and cables, generate a relatively high amount of heat. Because of that heat, providing adequate cooling to the IT racks in a data center is of paramount importance. Moreover, it is desirable that the IT racks be cooled as efficiently as possible, as the energy costs to cool IT racks may approach a large percentage of the energy costs to operate the data center.

Data centers typically have a raised floor system, often called an access floor system. An access floor system is usually comprised of a continuous array of access floor panels, arranged edge-to-edge, and supported above the sub-floor by support structure. The array of access floor panels usually extends wall-to-wall in the data centers.

A plenum is formed between the sub-floor and the access floor panel array. The cables and other equipment may be located, at least in part, in the plenum, and the plenum may also be used as a conduit for cooling air. Often, one or more air conditioning units supply cooling air to the plenum, and some of the access floor panels in the array have spaced openings or air passageways. The cooling air passes from the plenum through those openings or passageways into the area of the data center above the access floor panel array.

One way to improve the cooling efficiency of IT racks in a data center when access floor panels having openings or passageways are the cooling air conduit from (1) the plenum between the access floor panel array and the sub-floor to (2) the area above the access floor panel array is to direct the air passing through the panels toward the IT racks. There is a pending United States patent application that discloses an access floor panel having air directional grates to direct air at adjacent structure and/or equipment, such as IT racks, U.S. patent application Ser. No. 12/878,657. However, grated access floor panels cannot be used in every access floor system application.

U.S. Pat. No. 6,019,677 discloses an under-floor modular terminal for an HVAC system that can include multiple grills. Each grill of a particular terminal has the same pattern of openings, and openings of different sizes, shapes and directions are segregated in different areas of the grills. U.S. Pat. No. 6,256,952 discloses floor panels having different patterns of openings, none of which are disclosed as being directional. U.S. Pat. No. 5,192,348 discloses directional air diffuser panels for a clean room ceiling diffuser. The panels include openings of different sizes and shapes and at different angles that are segregated in separate areas of the panels.

SUMMARY OF THE INVENTION

In view of the above, there is a need for a directional air access floor panel that directs cooling air to the entire height of adjacent structure and/or equipment, such as IT racks in a data center, which is not a grated panel. This invention addresses that and other needs.

A directional air access floor panel according to one embodiment of this invention may include a top plate overlaying supporting substructure. The top plate may include a plurality of non-directional air passageways that are intermingled with a plurality of directional air passageways. Each of the plurality of directional air passageways may be configured to direct air through the top plate at an angle of other than 90° to the top plate.

In some embodiments, the directional air passageways may include holes in the top plate and tabs that are adjacent to the holes and extend downwardly. There may be a tab adjacent to each hole. The tabs are at an angle to the top surface of the top plate of other than 90°.

In further embodiments, the angle of the tabs to the top surface may be approximately 65°.

In yet other embodiments, each of the tabs is comprised of material of the top plate that is moved to define the holes.

DETAILED DESCRIPTION

Air directional access floor panel 10 is illustrated in FIGS. 1-4B. Panel 10 includes supporting substructure 35 and top plate 20. Top plate 20 is attached on top of supporting substructure 35. In other embodiments, top plate 20 and supporting substructure 35 can be a unitary structure.

Air directional access floor panel 10 can be made of any material or combination of materials that is capable of providing the structural rigidity required for a given application. Preferably, panel 10 is made of a metal or a combination of materials that includes metal.

In this embodiment, supporting substructure 35 is a unitary sheet of metal that has been shaped and formed such that it has outer lip 36, side wall 37, bottom wall 38, wells 39 and fingers 34.

Outer lip 36 is horizontal and forms the periphery of supporting substructure 35. The periphery of top plate 20 is attached to outer lip 36.

Sidewall 37 extends downwardly from the inside edge of outer lip 36 and forms a continuous outer wall of supporting substructure 35. Bottom wall 38 is spaced from top plate 20 and begins at the lowermost edge of sidewall 37.

Wells 39 are shaped like upside down cups, and are formed in part by fingers 34. The bottom of the wells 39 form circular openings in bottom wall 38. Fingers 34 extend upward from bottom wall 38 to the underside of top plate 20 and form the sidewalls of wells 39. The uppermost ends of fingers 34 are attached to the underside of top plate 20.

There are openings 33 in the sidewalls of wells 39 between adjacent fingers 34, so that air can pass through openings 33, for the reasons discussed below.

Supporting substructure 35 can have other configurations. Two limiting design considerations are that (1) the substructure must provide the desired rigidity and (2) air must be able to pass through it to reach the air passageways in top plate 20, as discussed below.

Further, while in this embodiment, supporting substructure 35 is a unitary member, supporting substructure 35 can be comprised of multiple members. For example, supporting substructure could comprise a support frame and understructure attached to the support frame and/or top plate 20. In addition, supporting substructure 35 could be a grid of members, or a frame with one or more cross members, including one or more cross members at an angle other than 90° with the frame. Supporting structure 35 could also have members that extend partially under top plate 20.

Top plate 20 has top surface 21 and includes a plurality of non-directional perforations or holes 40, a plurality of slots 60, and a plurality of downwardly-extending air directional tabs 50. There is a directional tab 50 immediately adjacent to each slot 60. In this embodiment, holes 40 and slots 60 are arranged in intermingled rows and columns. Holes 40 and slots 60 can be arranged differently, including being randomly intermingled. In this embodiment, there is at least one hole 40 between any two slots 60.

While, in this embodiment, top plate 20 is a unitary, substantially flat plate, in other embodiments, top plate 20 can be comprised of multiple pieces and top plate 20 does not have to be a substantially flat plate. For example, top plate could have ridges and valleys or integral supporting structure on its underside.

Further, while, in this embodiment, non-directional perforations or holes 40 are circular, they can be of any shape. Moreover, non-directional perforations or holes 40 can be of different sizes and arranged in different patterns from that illustrated in FIGS. 1-4B. Airflow through the non-directional perforations 40 is substantially perpendicular to a plane of top surface 21 of top plate 20.

Air directional tabs 50 and slots 60 are formed in the embodiment illustrated in FIGS. 1-4B by (1) making elongated U-shaped cuts in top plate 20 and (2) bending the material within the cuts downward along the uncut edges. The bending downward of air directional tabs 50 forms an elongated slot 60 next to each directional tab 50. Moreover, use of tabs 50 to form slots 60 reduces waste material.

Tabs 50 and slots 60 can be made/formed by any other manner, such as by (1) molding or forming top plate 20 with slots 60 in it or by cutting complete slots 60 in top plate 20 and (2) attaching a tab 50 adjacent to each slot 60.

Directional tabs 50 are bent downward at an angle that is less than 90° to the plane of top surface 21 of top plate 20. In this embodiment of the invention, that angle is approximately 65°. See FIG. 3B. Directional tabs 50 can be bent at other angles of less than 90° with respect to the plane of top surface 21 of top plate 20, depending, at least in part, on the desired angle of composite airflow through the panels, as discussed below. Moreover, in other embodiments, there can be two or more sets of tab 50, with each set having a different angle to top surface 21 of top plate 20. For example, there could be sets A-C. The tabs of set A could have an angle of 60° to the top surface of the top plate, the tabs of set B could have an angle of 70°, and the tabs of set C could have an angle of 80°.

By having directional tabs 50 at an angle of less that 90° to top surface 21 of top plate 20, airflow through slots 60 is directed by directional tabs 50 at an angle to top surface 21 of top plate 20.

Figure 1:
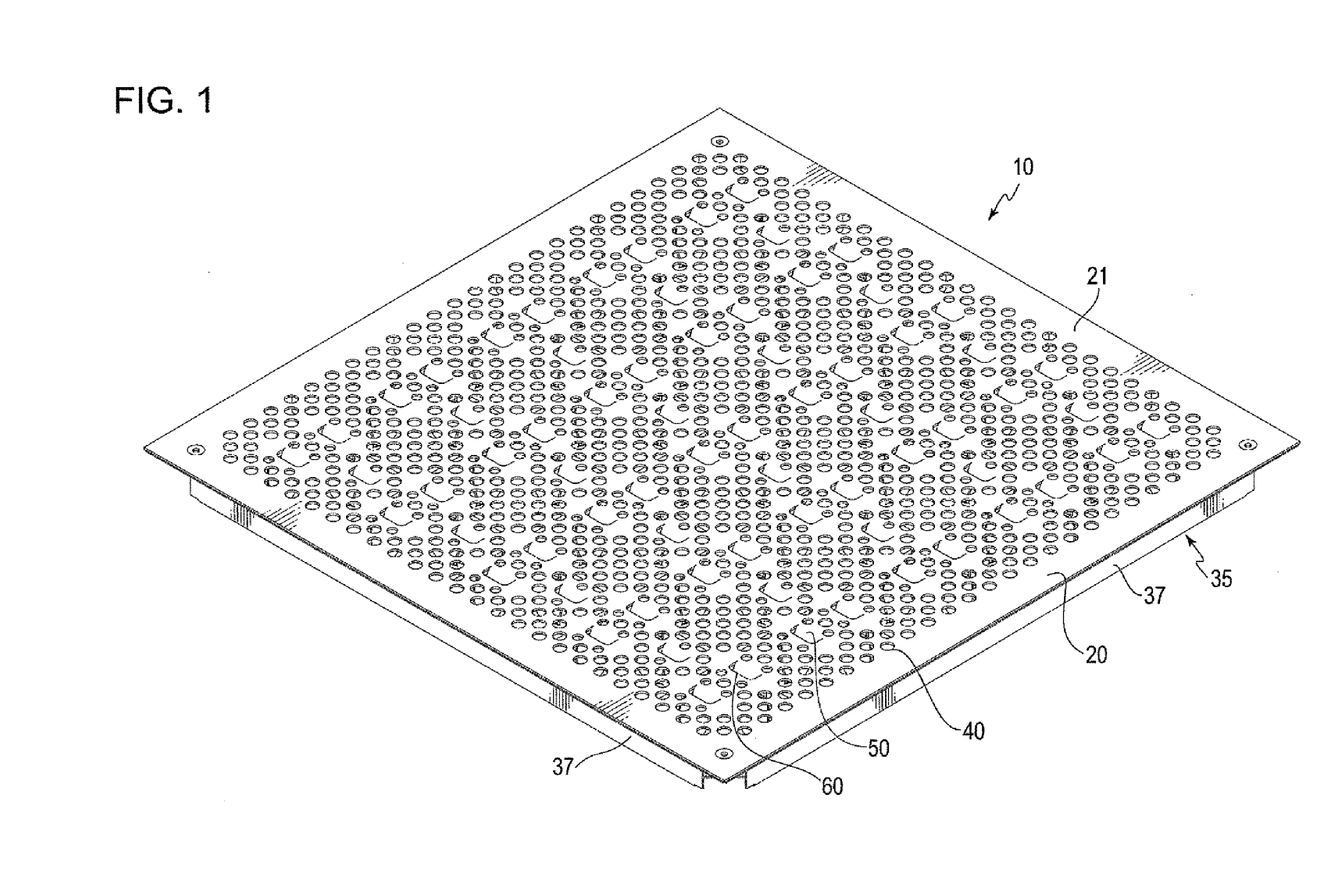
FIG. 1 is a top perspective view of an access floor panel according to one embodiment of this invention.
Figure 2:
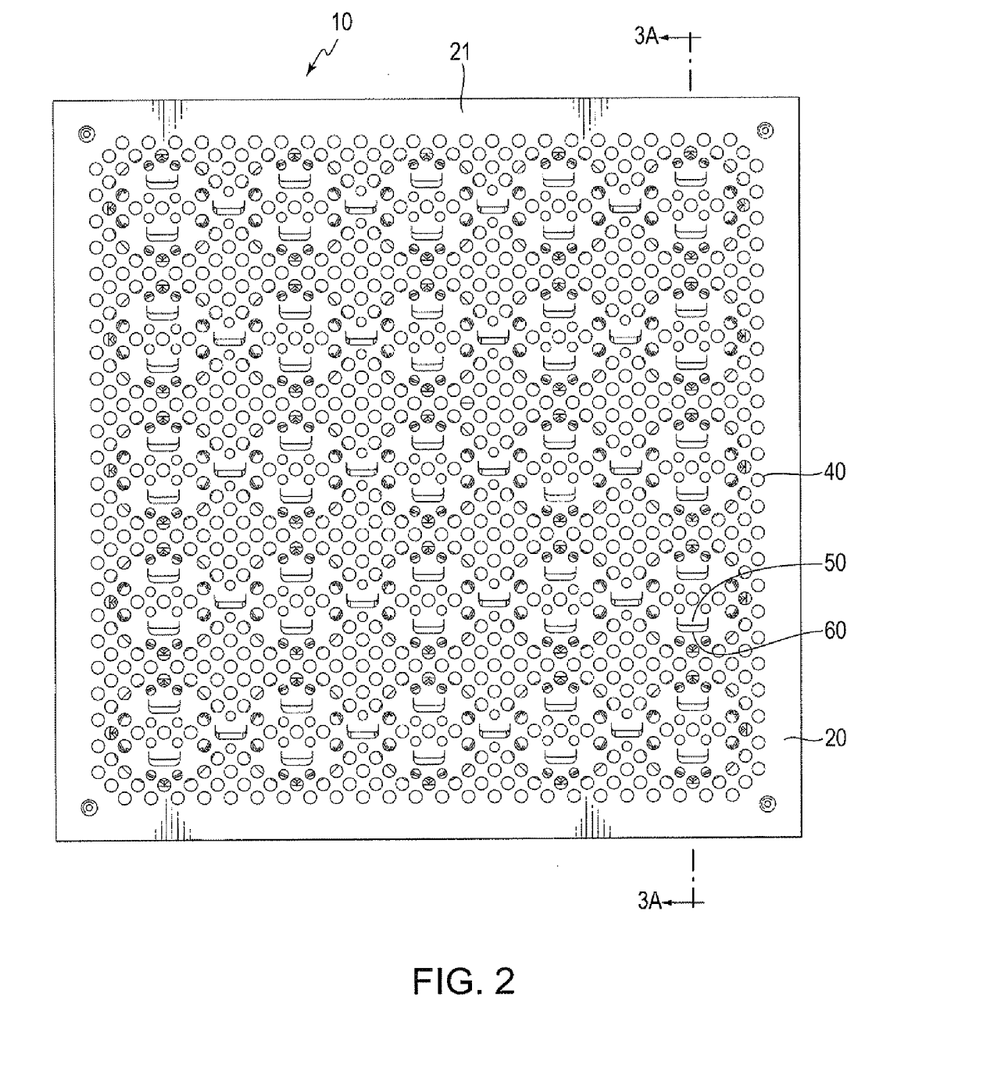
FIG. 2 is a top view of the access floor panel of FIG. 1.
Figure 3A:
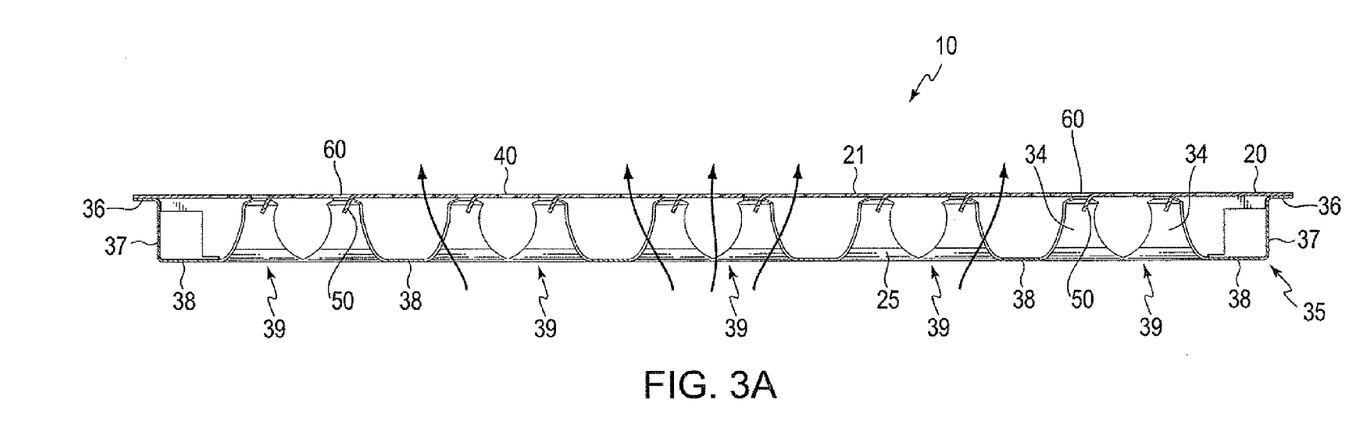
FIG. 3A is a cross-sectional view taken along line 3-3 in FIG. 2.
Figure 3B:
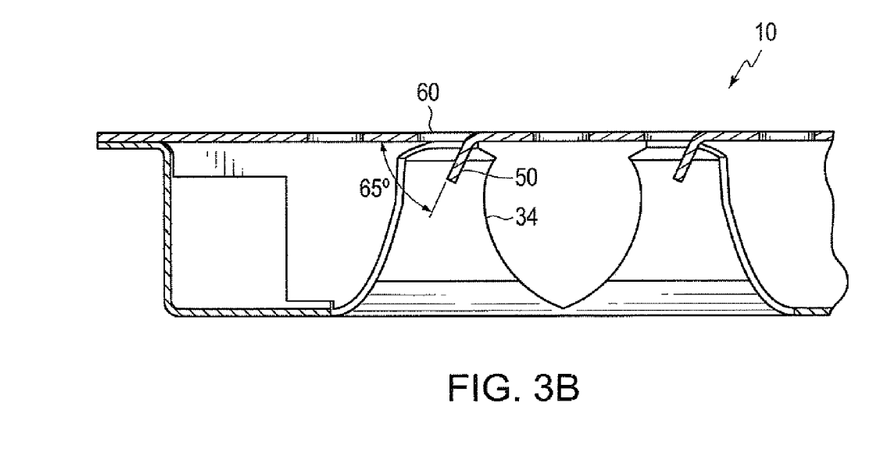
FIG. 3B is an enlarged view of a portion of FIG. 3A.
Figure 4A:
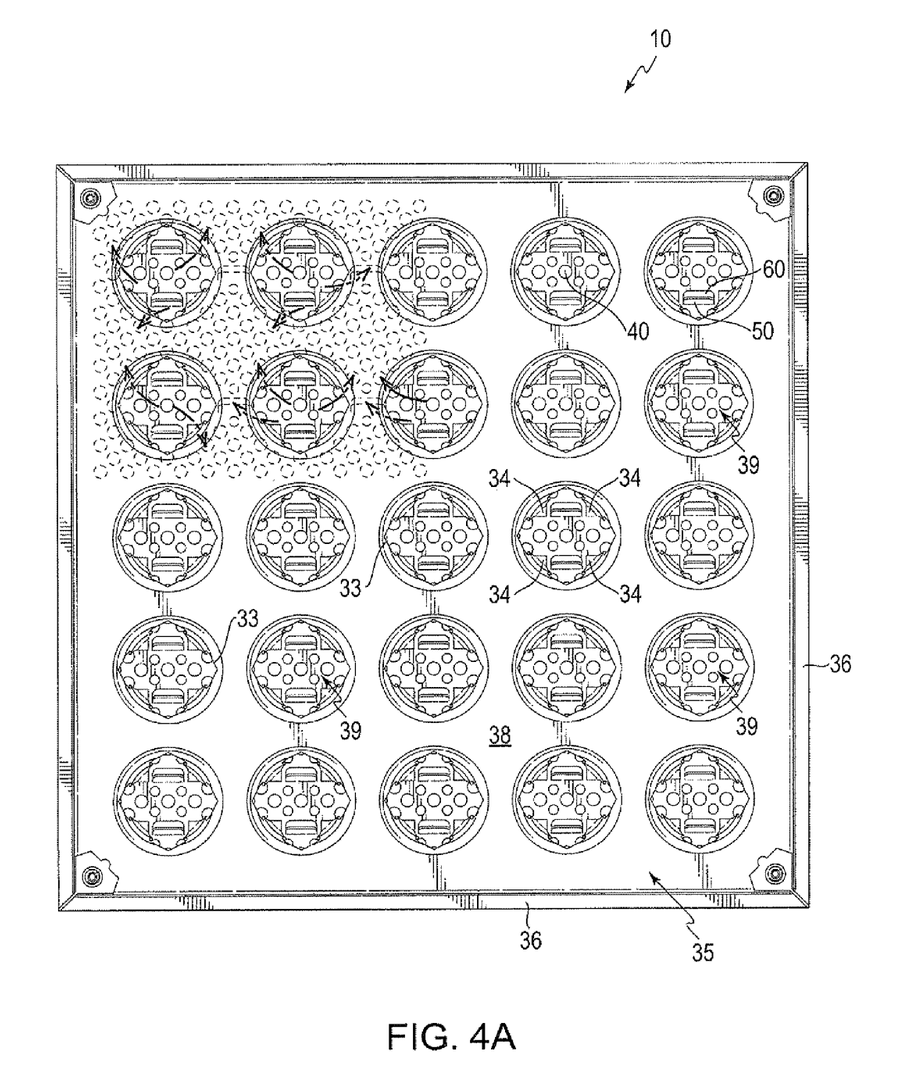
FIG. 4A is a bottom view of the access floor panel illustrated in FIGS. 1-3B.
Figure 4B:
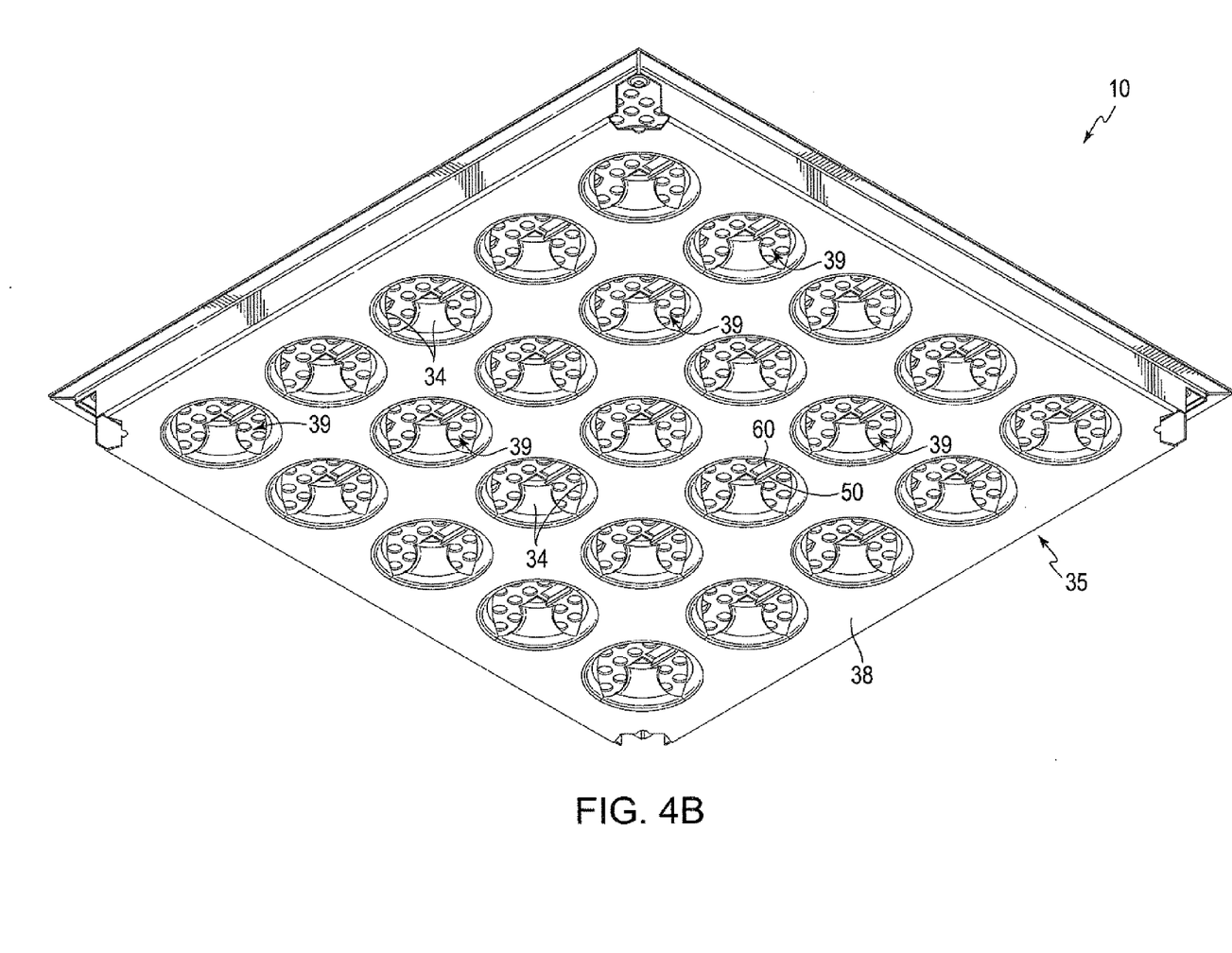
FIG. 4B is a bottom perspective view of the access floor panel illustrated in FIGS. 1-4A.

The flow of air through supporting substructure 35 to perforations or holes 40 and slots 60 is illustrated by the arrows in FIGS. 3A and 4A. As shown, the air passes angularly and horizontally through supporting substructure 35 to reach the perforations or holes 40 and slots 60 that can not be reached vertically through wells 39 of substructure 35.

As illustrated in FIGS. 1-4B and discussed above, non-directional perforations or holes 40 are intermingled with slots 60. That intermingling results in a combined airflow direction through air directional panel 10 that is at a desired angle with regard to top surface 21 of top plate 20, as discussed below.

Figure 5:
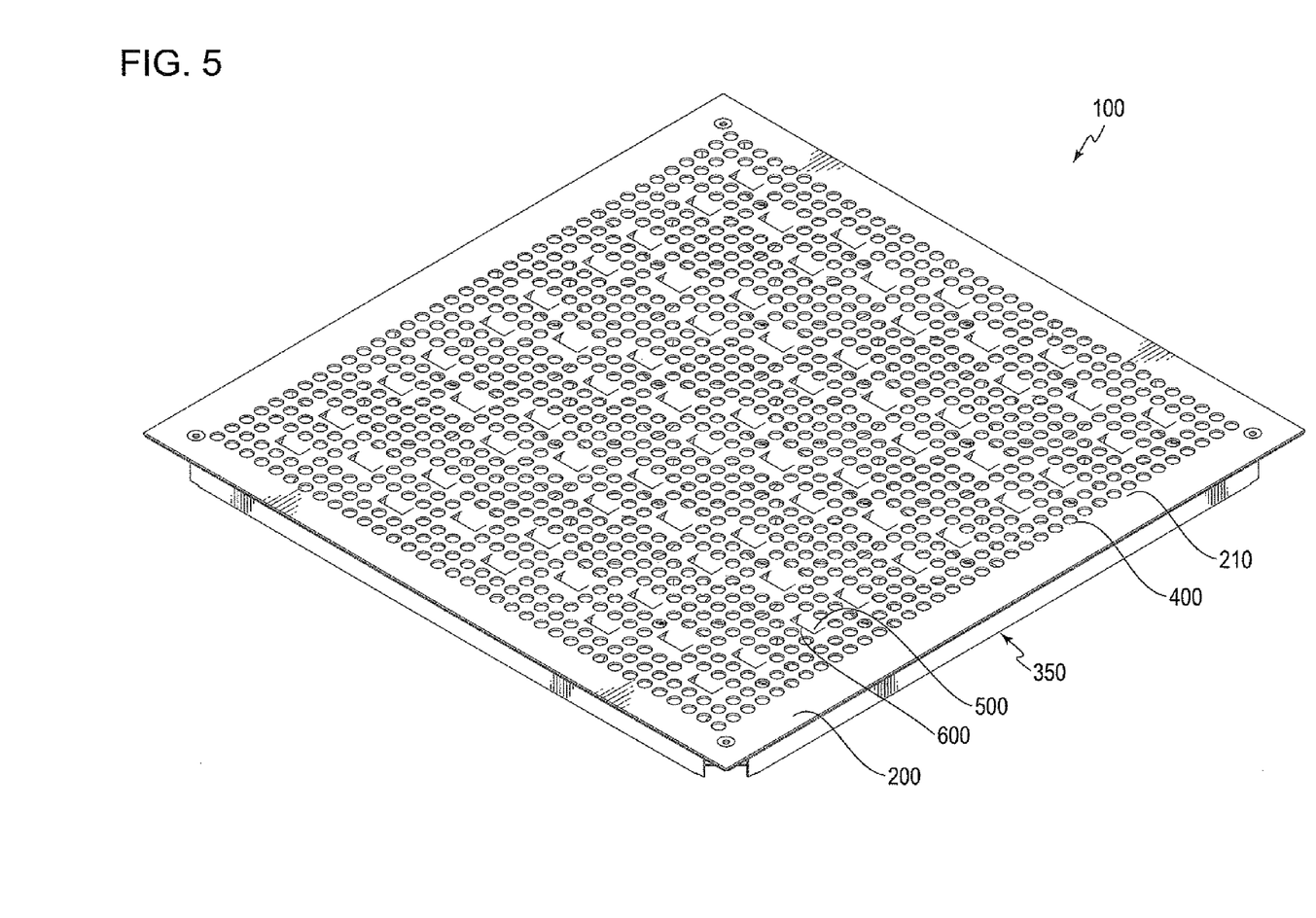
FIG. 5 is a top perspective view of an access floor panel according to a second embodiment of this invention.
Figure 6:
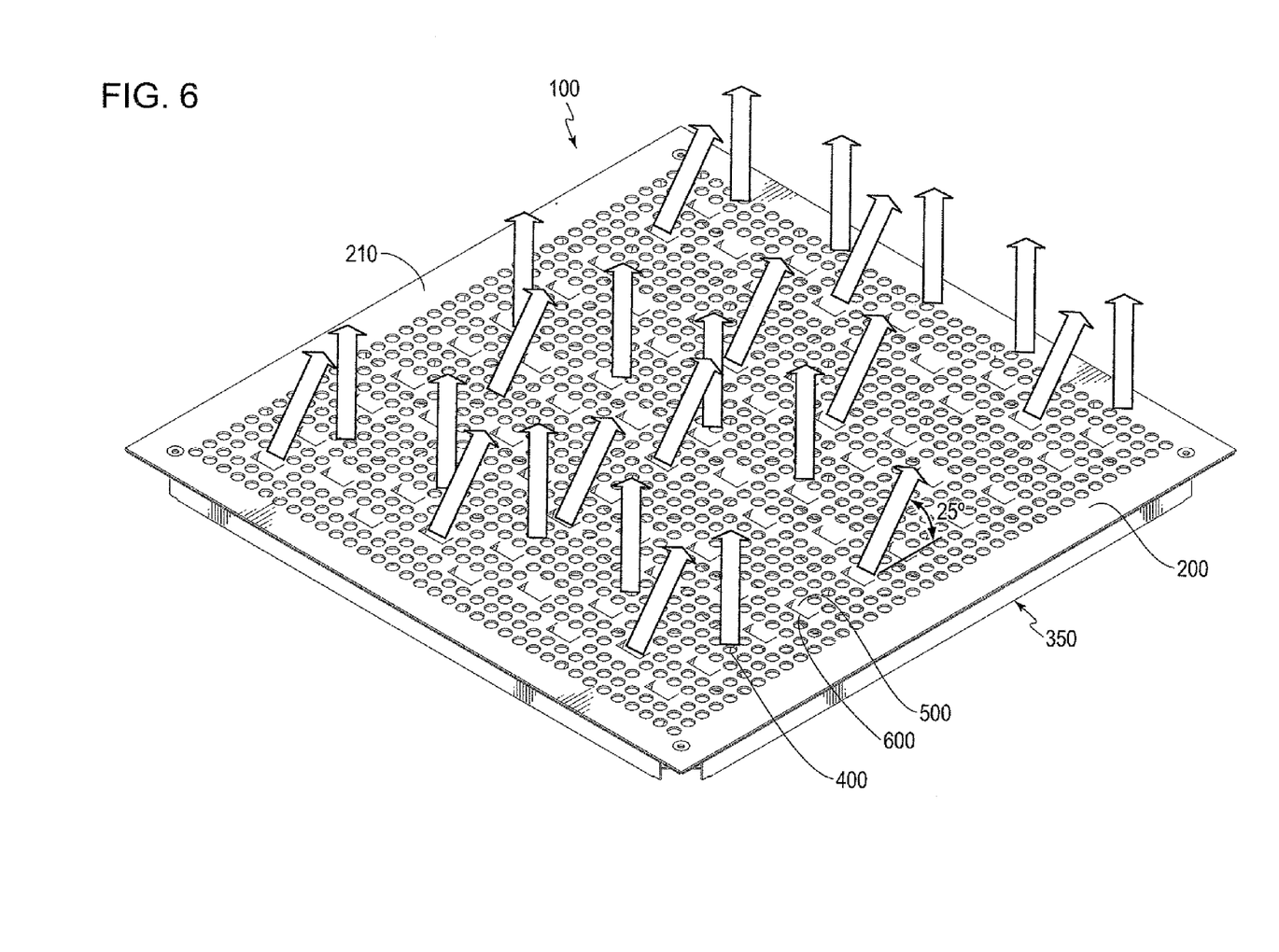
FIG. 6 is a perspective view illustrating the direction of the airflow through various openings or passageways in the access floor panel illustrated in FIG. 5.

Air directional panel 100 is illustrated in FIGS. 5 and 6 and includes top plate 200 (having top surface 210) and supporting substructure 350 that correspond to top plate 20 and supporting substructure 35 of panel 10. Top plate 200 includes a plurality of non-directional perforations or holes 400 intermingled with a plurality of directional tabs 500 that are adjacent to slots 600 that correspond to perforations or holes 40, directional tabs 50 and slots 60 of top plate 20. Directional tabs 500 are at an angle of approximately 65° with top surface 210. Directional tabs 500 are formed in a manner similar to that described above. However, as illustrated in FIG. 5, non-directional perforations 400 are aligned in columns instead of being staggered. In addition, directional tabs 500 have angular corners, whereas directional tabs 50 have rounded corners.

FIG. 6 illustrates the difference in the direction of airflow through the individual non-directional perforations or holes 400 and slots 600, respectively. In particular, the airflow direction through individual slots 600 is at an angle other than 90° to top plate 200 as a result of the plurality of directional tabs 500 being angled with respect to the plane of top surface 210 of top plate 200, whereas the airflow direction through the non-directional perforations 400 is perpendicular to top plate 200, as discussed above. As illustrated in FIG. 6, when tabs 500 are at an angle of approximately 65° to top surface 210, the airflow direction through slots 600 is at an angle of approximately 25% to top surface 210.

As with regard to air directional access floor panel 10, the combination of the airflow through the intermingled non-directional perforations or holes 400 and slots 600 in panel 100 results in a combined airflow direction that is at an angle to top surface 210 of top plate 200.

Figure 7:
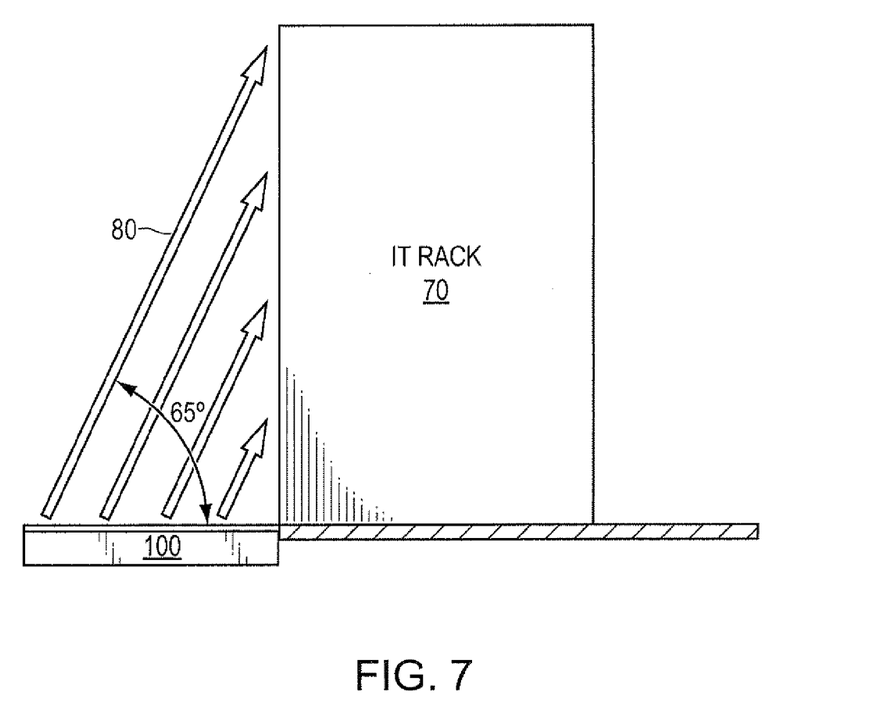
FIG. 7 is a schematic view illustrating the composite airflow through the openings or passageways in the access floor panels of FIGS. 1-6.

The air directional access floor panels of this invention, including panels 10 and 100, can be used to direct air at any structure or equipment that has high cooling needs. One particular use is to cool IT racks in data centers, such as IT rack 70 in FIG. 7. One or more of the panels of this invention can be placed adjacent the IT rack(s) in a data room to direct cooling air at the rack(s).

One advantage of the air directional panels of this invention is that they can be designed to direct air evenly throughout the height of adjacent structure and/or equipment, such as an IT rack. That directional cooling air flow results in more consistent cooling throughout the height of the adjacent structure and/or equipment and more economic cooling of that structure and/or equipment because less air bypasses the racks.

The height of the adjacent structure and/or equipment is important to the design of the air directional access floor panels of this invention for this reason. Once the spacing of the air directional access floor panels of this invention from the structure and/or equipment to be cooled by air from the panels is known, the angle of the composite air flow through the panels can be selected so that the composite air flow substantially extends the height of the structure and/or equipment. That angle depends on at least two factors: (1) the angle of the tabs to the top surface of the top plate and (2) the proportion of the air passing though the air directional slots versus the air passing through the non-directional perforations or holes.

In the embodiments illustrated by FIGS. 1-7, the selected combination of (1) the 65° angle of tabs 50 and 500 to the top surfaces 21 and 210 of top plates 20 and 200, respectively, and (2) the selected ratio of air passing through slots 50 and 500 and non-directional perforations 40 and 400 (approximately 22% of the air passes through the slots 50 and 500 and approximately 78% through the non-directional perforations 40 and 400), respectively, results in a composite air flow direction 80 of approximately 65° from top surfaces 21 and 210 of top plates 20 and 200. See FIG. 7. As stated, that angle of the composite air flow direction can be changed by changing (1) the angle of tabs 50 and 500 to top surfaces 21 and 210, respectively, and/or (2) the relative percentages of the air passing through slots 50 and 500 and non-directional perforations 40 and 400, respectively.

What has been described and illustrated herein are preferred embodiments of the invention along with some variations. The terms, descriptions and figures used herein are set forth by way of illustration only and are not meant as limitations. Those skilled in the art will recognize that many variations are possible within the spirit and scope of the invention, which is intended to be defined by the following claims—and their equivalents—in which all terms are meant in their broadest reasonable sense unless otherwise indicated.

What is claimed is:

1. An access floor panel comprising:
   supporting substructure; and
   a top plate overlaying the supporting substructure;
   wherein (a) the top plate includes a plurality of non-directional air passageways that are intermingled with a plurality of directional air passageways, (b) each of the plurality of directional air passageways is configured to direct airflow through the top plate at an angle to the top plate of other than 90°, and (c)
   the plurality of directional air passageways each only extend partly through the supporting substructure when viewed in cross section; and
   wherein the supporting substructure comprises a plurality of wells having side walls with well openings formed therein.

2. The access floor panel according to claim 1, wherein the plurality of non-directional air passageways are holes in the top plate.

3. The access floor panel according to claim 1, wherein the top plate includes a top surface and the directional air passageways include openings in the top plate and tabs that extend downwardly, such that at least one of the tabs is adjacent to each of the openings, and wherein the tabs are at an angle with the top surface of other than 90°.

4. The access floor panel according to claim 3, wherein at least one of the tabs is immediately adjacent to each of the openings.

5. The access floor panel according to claim 3, wherein the angle of the plurality of tabs to the top surface is approximately 65°.

6. The access floor panel according to claim 3, wherein the tabs are comprised of material of the top plate that is moved to form the openings.

7. The access floor panel according to claim 6, wherein the supporting substructure has passageways through which air is intended to pass to enter at least some of the non-directional air passageways and the directional air passageways.

8. The access floor panel according to claim 3, wherein the angle of the tabs and the ratio of the plurality of non-directional air passageways to the plurality of directional air passageways results in a combined airflow direction through the access floor panel at an angle of substantially 65° to the top surface of the top plate.

9. An access floor panel according to claim 1, wherein the supporting substructure includes a grid of cross supports.

10. An access floor panel according to claim 1, wherein the plurality of directional air passageways and the plurality of non-directional air passageways are arranged in columns and rows.

11. An access floor panel according to claim 1, wherein the top plate and the supporting substructure are different members and the top plate is attached to the supporting substructure.

12. An access floor panel according to claim 11, wherein the supporting substructure is a unitary piece of material that has lower portions spaced from the top plate and portions extending from the lower portions to the underside of the top plate.

13. An access floor panel according to claim 12, wherein the portions extending from the lower portions to the underside of the top plate are spaced fingers that form the wells.

14. An access floor panel accordingly to claim 13, wherein the spaced fingers are attached to the underside of the top plate.

15. An access floor panel according to claim 14, wherein the spaced fingers form partial side walls of the wells that extend from the lower portions to the top plate.

16. An access floor panel according to claim 1, wherein there is at least one of the non-directional air passageways located between any two of the directional air passageways.

17. An access floor panel according to claim 1, wherein the directional air passageways are openings in the top plate and tabs that extend downwardly adjacent the openings.

18. An access floor panel according to claim 17, wherein at least one of the tabs is immediately adjacent each of the openings.

19. An access floor panel according to claim 18, wherein the tabs are at an angle to a top surface of the top plate of other than 90°.

20. An access floor panel according to claim 1, wherein the wells are shaped like upside down cups.

* * * * *